(12) United States Patent
Suzuki et al.

(10) Patent No.: US 10,840,014 B2
(45) Date of Patent: Nov. 17, 2020

(54) COIL UNIT, AND POWER TRANSMITTING DEVICE, POWER RECEIVING DEVICE AND WIRELESS POWER TRANSMISSION SYSTEM USING THE COIL UNIT

(71) Applicant: TDK CORPORATION, Tokyo (JP)

(72) Inventors: Mitsunari Suzuki, Tokyo (JP); Kota Arasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 197 days.

(21) Appl. No.: 16/044,743

(22) Filed: Jul. 25, 2018

(65) Prior Publication Data

US 2019/0035547 A1 Jan. 31, 2019

(30) Foreign Application Priority Data

Jul. 27, 2017 (JP) .................................. 2017-145944

(51) Int. Cl.

| | |
|---|---|
| *H01F 38/14* | (2006.01) |
| *H02J 50/10* | (2016.01) |
| *H02J 7/02* | (2016.01) |
| *H02J 50/70* | (2016.01) |
| *H05K 7/20* | (2006.01) |
| *H01F 27/36* | (2006.01) |
| *H04B 5/00* | (2006.01) |
| *H02J 50/80* | (2016.01) |
| *H01F 27/02* | (2006.01) |
| *H01F 27/40* | (2006.01) |
| *H02J 50/12* | (2016.01) |
| *H02J 5/00* | (2016.01) |
| *H01F 3/10* | (2006.01) |

(52) U.S. Cl.
CPC ............. *H01F 38/14* (2013.01); *H01F 27/02* (2013.01); *H01F 27/36* (2013.01); *H01F 27/367* (2013.01); *H01F 27/40* (2013.01); *H02J 7/025* (2013.01); *H02J 50/10* (2016.02); *H02J 50/12* (2016.02); *H02J 50/70* (2016.02); *H02J 50/80* (2016.02); *H04B 5/0075* (2013.01); *H05K 7/20* (2013.01); *H01F 2003/106* (2013.01); *H02J 5/005* (2013.01)

(58) Field of Classification Search
CPC ............ H01F 38/14; H02J 50/80; H02J 50/10
USPC ........................................................ 307/104
See application file for complete search history.

(56) References Cited

U.S. PATENT DOCUMENTS 10,574,091 B2 * 2/2020 Lestoquoy .............. H02J 50/12

FOREIGN PATENT DOCUMENTS

| | | |
|---|---|---|
| JP | 4-134815 | 12/1992 |
| JP | 2016-103613 A | 6/2016 |

* cited by examiner

*Primary Examiner* — Michael R. Fin
(74) *Attorney, Agent, or Firm* — Young Law Firm, P.C.

(57) ABSTRACT

Disclosed herein is a coil unit that includes a coil formed by spirally winding a conductive wire, a capacitor electrically connected to the coil, a magnetic member covering the coil in an axial direction of the coil, a first metal shield covering the coil with the magnetic member interposed therebetween, and a second metal shield disposed between the magnetic member and the first metal shield so as to form a space for housing the capacitor. The second metal shield is disposed so as to be thermally connected to the first metal shield. An outer dimension of the second metal shield as viewed in the axial direction of the coil is equal to or smaller than an outer dimension of the magnetic member.

14 Claims, 5 Drawing Sheets

COIL UNIT, AND POWER TRANSMITTING DEVICE, POWER RECEIVING DEVICE AND WIRELESS POWER TRANSMISSION SYSTEM USING THE COIL UNIT

BACKGROUND OF THE INVENTION

Field of the Invention

The present invention relates to the structure of a coil unit suitably used for a wireless power transmission system. The present invention also relates to a power transmitting device, a power receiving device and a wireless power transmission system using the coil unit.

Description of Related Art

A wireless power transmission technology that transmits power without using a power cable or cord is now attracting attention. The wireless power transmission technology allows power to be transmitted from a power transmitting side to a power receiving side by wireless and is thus expected to be applied to various products such as transport equipment (electric trains, electric cars, unmanned carriers, etc.), home electric appliances, electronic devices, wireless communication devices, toys, and industrial equipment.

As the wireless power transmission technology, there is known a power transmission system that utilizes a resonance phenomenon for the purpose of extending a transmission distance. The resonance phenomenon is generated by a resonance circuit formed by a coil connected with a capacitor.

In the above power transmission system, by integrating the coil and the capacitor with each other, size reduction of the coil unit is attained. For example, JP 2016-103612 A discloses a coil unit in which a capacitor is disposed in a protruding support part of a shield member.

However, in the technology disclosed in JP 2016-103612 A, the outer dimension of the shield member is larger than that of a core member, so that a magnetic flux generated from the coil easily interlinks the shield member, which may cause the shield member to generate heat. Further, JP 2016-103612 A does not mention anything about exhaust of heat generated due to current flow in the coil, and the heat generation may lead to breakage of components, such as a coil and capacitor, constituting the coil unit.

SUMMARY

The present invention has been made in view of the above problem, and the object thereof is to provide a coil unit capable of suppressing heat generation and efficiently radiating heat, and a power transmitting device, a power receiving device and a wireless power transmission system using the coil unit.

To solve the above problems, according to the present invention, there is provided a coil unit including a coil formed by spirally winding a conductive wire, a capacitor electrically connected to the coil, a magnetic member covering the coil in an axial direction of the coil, a first metal shield covering the coil with the magnetic member interposed therebetween, and a second metal shield disposed between the magnetic member and the first metal shield so as to form a space for housing the capacitor. The second metal shield is disposed so as to be thermally connected to the first metal shield. An outer dimension of the second metal shield as viewed in the axial direction of the coil is equal to or smaller than an outer dimension of the magnetic member.

A power transmitting device according to the present invention includes a coil unit having the above-described features of the present invention and an inverter circuit connected to the coil unit. According to the present invention, there can be provided a power transmitting device capable of reducing a leakage magnetic flux largely circulating a region away from its opposing coil while suppressing heat generation.

A power receiving device according to the present invention includes a coil unit having the above-described features of the present invention and a rectifying circuit connected to the coil unit. According to the present invention, there can be provided a power receiving device capable of reducing a leakage magnetic flux largely circulating a region away from its opposing coil while suppressing heat generation.

A wireless power transmission system according to the present invention includes a power transmitting device that transmits power by wireless and a power receiving device that receives the power from the power transmitting device by wireless. At least one of the power transmitting device and power receiving device includes a coil unit having the above-described features of the present invention. According to the present invention, there can be provided a wireless power transmission system capable of reducing a leakage magnetic flux largely circulating a region away from its opposing coil while suppressing heat generation.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
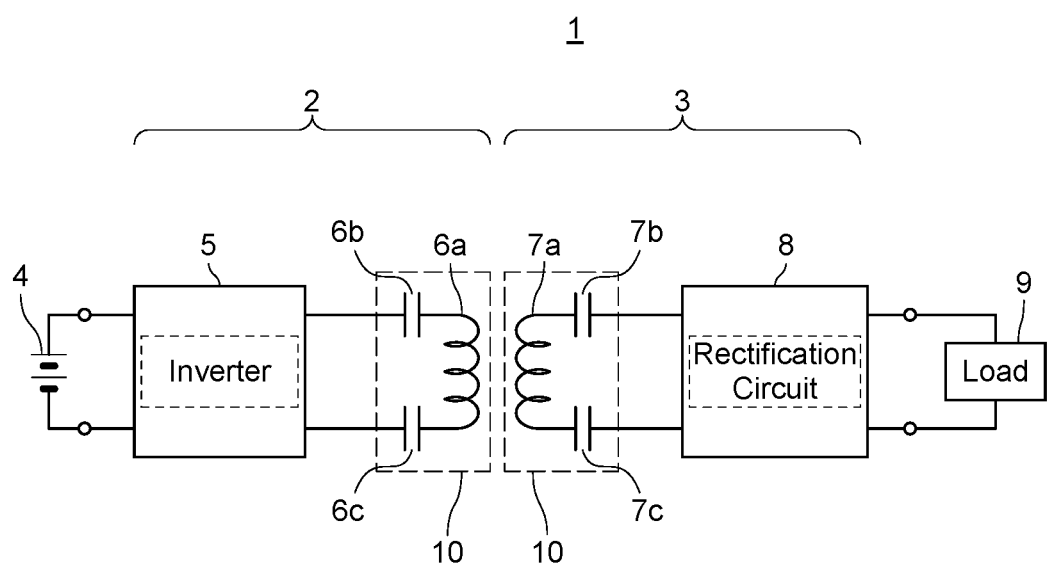
FIG. 1 is a block diagram illustrating the configuration of a wireless power transmission system according to a preferred embodiment of the present invention.

FIG. 1 is a block diagram illustrating the configuration of a wireless power transmission system according to a preferred embodiment of the present invention.

As illustrated in FIG. 1, a wireless power transmission system 1 includes a combination of a power transmitting device 2 and a power receiving device 3 and transmits power from the power transmitting device 2 to the power receiving device 3 by wireless.

The power transmitting device 2 includes a DC power supply 4, a power transmitting circuit 5 including an inverter circuit that converts a DC voltage supplied from the DC power supply 4 into an AC voltage of, e.g., 100 kHz, and a coil unit 10 including a power transmitting coil 6a that generates an AC magnetic flux by the AC voltage. Although the coil unit 10 according to the present embodiment constitutes an LC series resonance circuit in which capacitors 6b and 6c are connected in series respectively to both ends of the power transmitting coil 6a, it may constitute an LC parallel resonance circuit or an LC series-parallel resonance circuit. The number of the capacitors is not particularly limited, and a configuration in which only the capacitor 6b is connected is possible.

The power receiving device 3 includes a coil unit 10 including a power receiving coil 7a that receives at least a part of the AC magnetic flux generated by the power transmitting coil 6a to generate an AC voltage and a power receiving circuit 8 including a rectifying circuit that converts the AC voltage generated by the power receiving coil 7a into a DC voltage. The rectifying circuit may have a smoothing function. The DC voltage output from the power receiving device 3 is supplied to a load 9. Although the coil unit 10 according to the present embodiment constitutes an LC series resonance circuit in which capacitors 7b and 7c are connected in series respectively to both ends of the power receiving coil 7a, it may constitute an LC parallel resonance circuit or an LC series-parallel resonance circuit. The number of the capacitors is not particularly limited, and a configuration in which only the capacitor 7b is connected is possible.

Figure 2:
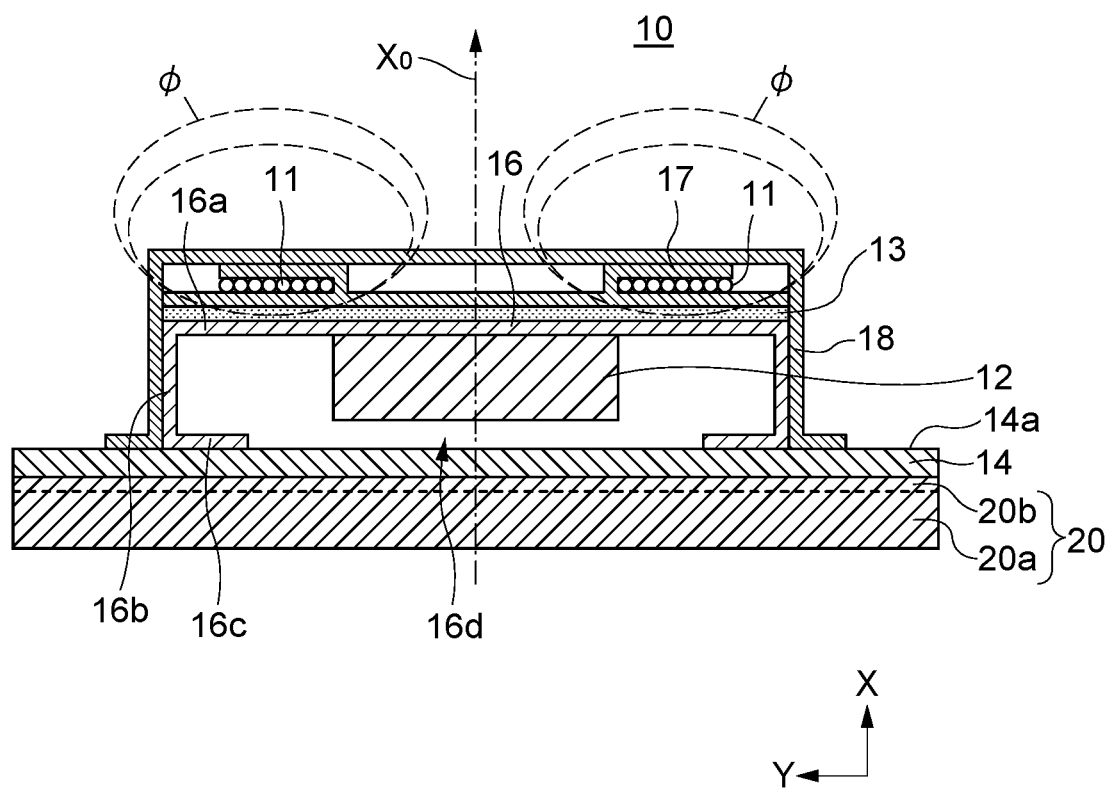
FIG. 2 is a schematic cross-sectional view illustrating the configuration of the coil unit according to a first embodiment of the present invention.
Figure 3:
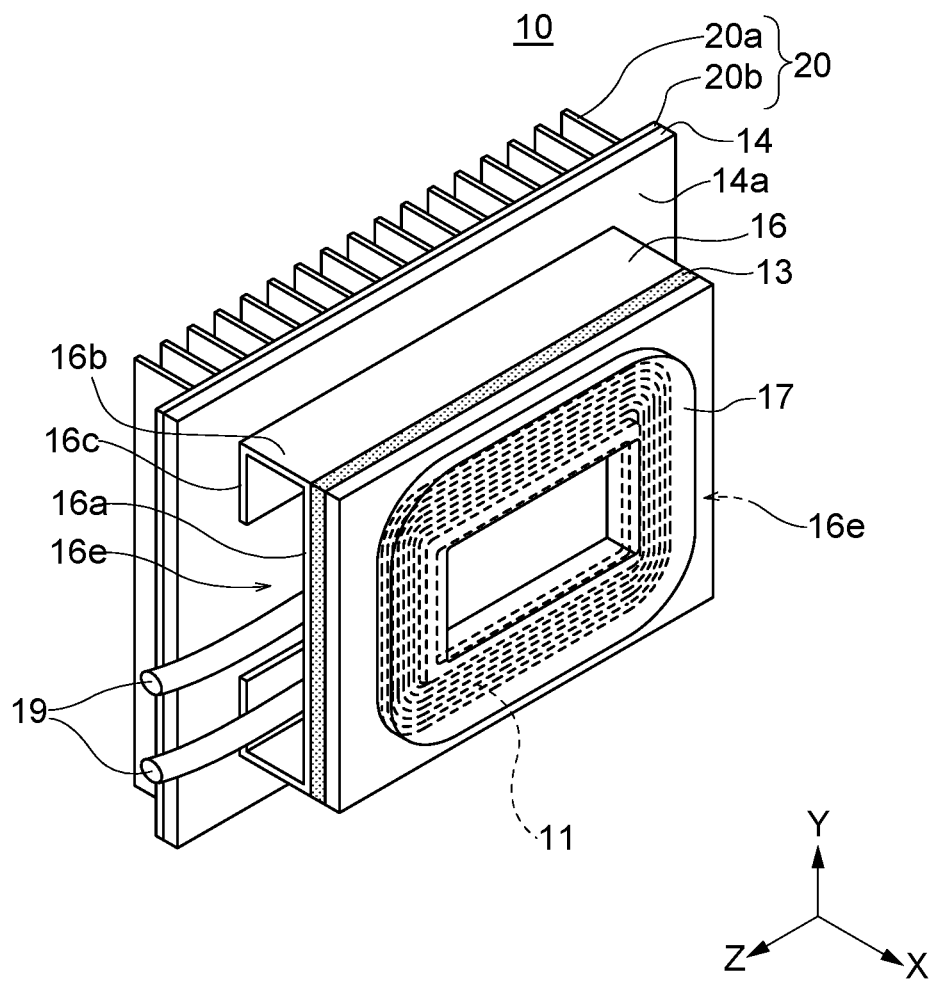
FIG. 3 is a perspective view of the coil unit in a state where a resin cover is detached.
Figure 4:
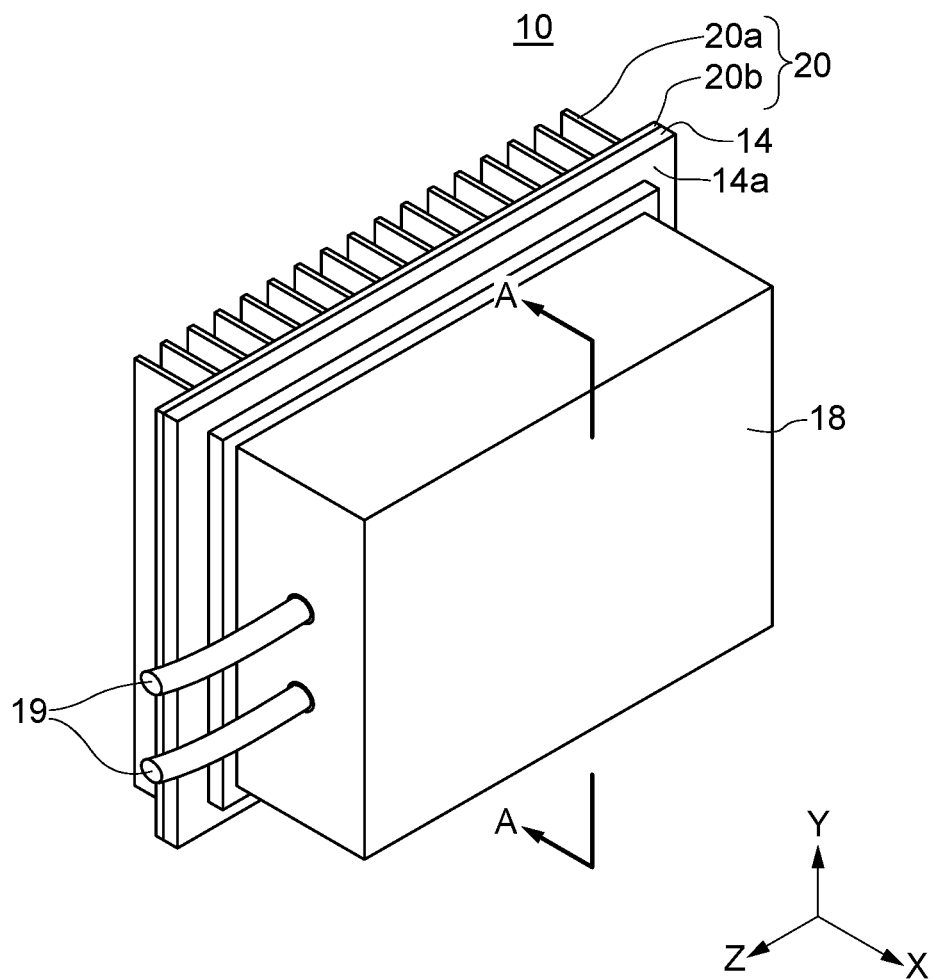
FIG. 4 is a perspective view of the coil unit in a state where a resin cover is attached.

FIG. 2 is a schematic cross-sectional view illustrating the configuration of the coil unit 10 used in both the power transmitting side and power receiving side. FIGS. 3 and 4 are each a perspective view of the coil unit 10. FIG. 3 illustrates a state where a resin cover 18 is detached, and FIG. 4 illustrates a state where the resin cover 18 is attached. FIG. 2 is a schematic cross-sectional view taken along line A-A of FIG. 4.

As illustrated in FIGS. 2 to 4, the coil unit 10 includes a coil 11 formed by spirally winding a conductive wire, a capacitor 12 electrically connected to the coil 11 to constitute an LC resonance circuit, a magnetic member 13 disposed on the back side of the coil 11, a base shield 14 (first metal shield) disposed on the back side of the magnetic member 13, and a shield box 16 disposed between the magnetic member 13 and the base shield 14 and housing the capacitor 12. The back side of the coil 11 refers to one end side in the extending direction of a coil axis $X_0$ of the coil 11, which is the side opposite to a main surface of the coil 11 that faces a power transmission direction. The back side of the magnetic member 13 refers to the side of the magnetic member 13 that faces away from the surface thereof opposite to the coil 11.

The coil 11 corresponds to the coil 6a or 7a of FIG. 1. The coil 11 is wound around a resin bobbin 17 and is housed inside the resin cover 18. Although the coil 11 according to the present embodiment has a single layer structure, it may have a multilayer structure. Although the planar shape of the coil 11 is preferably an ellipse elongated in one direction, an oval, or a substantially rectangular shape, it may be a perfect circle or a substantially square shape.

The capacitor 12 corresponds to the capacitors 6b and 6c or capacitors 7b and 7c of FIG. 1. The capacitor 12 is packaged together with the coil 11 to constitute a power transmitting coil unit. While the capacitor 12 is attached to the shield box 16 in the present embodiment, but may be attached to the base shield 14. Since the capacitor 12 is disposed on the back side of the coil 11 with the magnetic member 13 and the shield box 16 interposed therebetween, it does not block power transmission by the metal part (terminal electrode, internal electrode, etc.) thereof. A pair of terminals of the LC resonance circuit constituted by the coil 11 and capacitor 12 are each connected with a power cable 19.

The magnetic member 13 is a sheet-like or plate-like member made of a magnetic material such as ferrite and is provided so as to cover the entire back surface of the coil 11. The magnetic member 13 may be an aggregate of a plurality of magnetic pieces. In the present embodiment, the magnetic member 13 is bonded to the back surface of the bobbin 17. By thus providing the magnetic member 13 on the back side of the coil 11, a magnetic path for a magnetic flux φ interlinking the coil 11 can be ensured, whereby power transmission efficiency can be enhanced.

The base shield 14 is a support made of metal such as copper or aluminum and having an outer dimension larger than those of the coil 11 and magnetic member 13. The base shield 14 is provided for shielding a magnetic flux leaking to the back side of the coil 11. A heat sink 20 is provided on the back side of the base shield 14 that is the side facing away from the surface opposite to the shield box 16. The heat sink 20 is constituted of a plurality of extending fins 20a and a flat plate part 20b on which the fins 20a are provided, and the flat plate part 20b is connected to the back surface of the base shield 14. In a coil unit that handles high power, heat generation amounts of the coil 11 and magnetic member 13 become significantly large. So, by forming the back side of the base shield 14 that is the side opposite to the power transmission direction of the coil 11 into a heat sink structure, heat radiation performance of the coil unit 10 can be enhanced. Although the heat sink 20 is formed of a separate member from the base shield 14 in the present embodiment, the base shield 14 and the flat plate part 20b of the heat sink 20 may be made common and integrally formed.

The shield box 16 is a substantially box-shaped metal frame provided for ensuring a space for housing the capacitor 12 on the back side of the coil 11. The shield box 16 according to the present embodiment is formed simply by bending a single metal plate such as a copper plate or an aluminum plate and has a substantially parallelepiped outer shape. Specifically, the shield box 16 has a flat plate part 16a disposed opposite to the back surface of the magnetic member 13, a side wall 16b extending from both end portions of the flat plate part 16a in the width direction, and a flange part 16c formed by bending inward (or outward) the leading end portion of the side wall 16b. A housing slot 16d for the capacitor 12 is provided on the back side of shield box 16 opposite to the base shield 14. Thus, the shield box 16 according to the present embodiment has a planar shape elongated in one direction as viewed in the axial direction of the coil.

The flat plate part 16a of the shield box 16 contacts the back surface of the magnetic member 13 directly or through an intermediate material such as a thermal compound and is thermally connected to the magnetic member 13. The flange part 16c of the shield box 16 contacts a main surface 14a of the base shield 14 directly or through an intermediate material such as a thermal compound. With this configuration, the flat plate part 16a of the shield box 16 (second metal shield) is thermally connected to the base shield 14 (first metal shield) through the side wall 16b and flange part 16c. In particular, the flat part of the flange part 16c is opposed to the main surface 14a of the base shield 14 and, thus the base shield 14 and the shield box 16 are in surface contact with each other, thus enhancing heat conductivity.

In the present embodiment, the outer dimension of the flat plate part 16a of the shield box 16 (second metal shield) as viewed in the direction of the coil axis $X_0$ is preferably equal to or smaller than the outer dimension of the magnetic member 13. That is, the profile of the flat plate part 16a coincides with or falls within the profile of the magnetic member 13 (i.e., does not protrude from the profile of the magnetic member 13). With this configuration, a magnetic flux 4e emitted from an end portion 13e of the magnetic member 13 does not interlink the flat plate part 16a, thus making it possible to prevent heat generation of the flat plate part 16a.

As illustrated, the magnetic member 13 and the flat plate part 16a of the shield box 16 may each have a flat-plate shape as a whole. Alternatively, the magnetic member 13 and the flat plate part 16a may each have a shape having, at the center thereof, an opening corresponding to an opening of the coil 11, or a shape further having a slit extending outward from the opening. Also in these cases, the profile of the opening of the flat plate part 16a should not protrude from the profile of the magnetic member 13 in order to prevent heat generation of the flat plate part 16a.

As illustrated in FIG. 3, an opening 16e is formed in a part of the side wall 16b of the shield box 16 surrounding the capacitor 12, and the power cable 19 connected to the coil 11 or capacitor 12 is drawn outside the shield box 16 through the opening 16e. The leading ends of the pair of power cables 19 are connected to the inverter circuit in the case of the coil unit 10 of the power transmitting device 2 and connected to the rectifying circuit in the case of the coil unit 10 of the power receiving device 3.

The opening 16e is preferably formed at both ends of shield box 16 in the longitudinal direction, and the power cable 19 is drawn out from one of the two openings 16e. In a system where power is transmitted in substantially the horizontal direction with the coil surface vertically erected, height reduction of the coil unit 10 can be achieved by installing the coil unit 10 widthwise. In this case, when the opening is formed in the side wall on one end side of the shield box 16 in the short length direction, the height of the coil unit 10 is increased by the power cable 19 drawn from the one end side of the shield box 16 in the short direction. However, when the power cable 19 is drawn from one end side of the coil unit 10 in the longitudinal direction, the height reduction of the coil unit 10 is not hindered by the power cable 19, thus allowing e height reduction of the entire coil unit 10.

The side wall 16b and flange part 16c are preferably arranged in the longitudinal direction of the shield box 16 (flat plate part 16a). With this structure, the sectional area of a heat conducting path can be increased, and an area that the shield box 16 contacts the base shield 14 can be ensured as widely as possible, whereby thermal resistance can be reduced to enhance heat radiation performance. Further, the opening 16e can be formed at the both ends of the shield box 16 in the longitudinal direction, whereby the power cable 19 can be drawn horizontally. Thus, as illustrated in FIG. 3, when power transmission is performed in substantially the horizontal direction with the coil surface erected vertically, the coil unit 10 can be installed widthwise, whereby height reduction of the coil unit 10 can be achieved.

It is preferable that the coil axis $X_0$ of the coil 11 extends in substantially the horizontal direction, and that the wireless power transmission system 1 performs power transmission in substantially the horizontal direction. When power transmission is performed in the vertical direction with the power transmitting coil and power receiving coil vertically facing each other, there is a fear that a state where a metal foreign matter exists on the upper surface of the coil facing upward is continued. In this case, power transmission efficiency may be deteriorated due to existence of the metal foreign matter to disable power transmission. However, when power transmission is performed in substantially the horizontal direction with the coil surface vertically erected, metal that may adhere to the vertically erected coil surface falls from the coil surface, making it possible to avoid deterioration in power transmission efficiency and further to avoid heat generation of the metal foreign matter.

As described above, in the coil unit 10 according to the present embodiment, the outer dimension of the shield box 16 (second metal shield) does not protrude from the magnetic member 13 in a plan view, so that it is possible to prevent a magnetic flux generated from the coil 11 and emitted from the end portion of the magnetic member 13 from interlinking the flat plate part 16a, thereby making it possible to suppress heat generation of the flat plate part 16a associated with an eddy current generated by interlinkage of the magnetic flux. Further, the shield box 16 is thermally connected to the base shield 14 (first metal shield), allowing heat generated in the coil unit 10 to be radiated efficiently.

Figure 5:
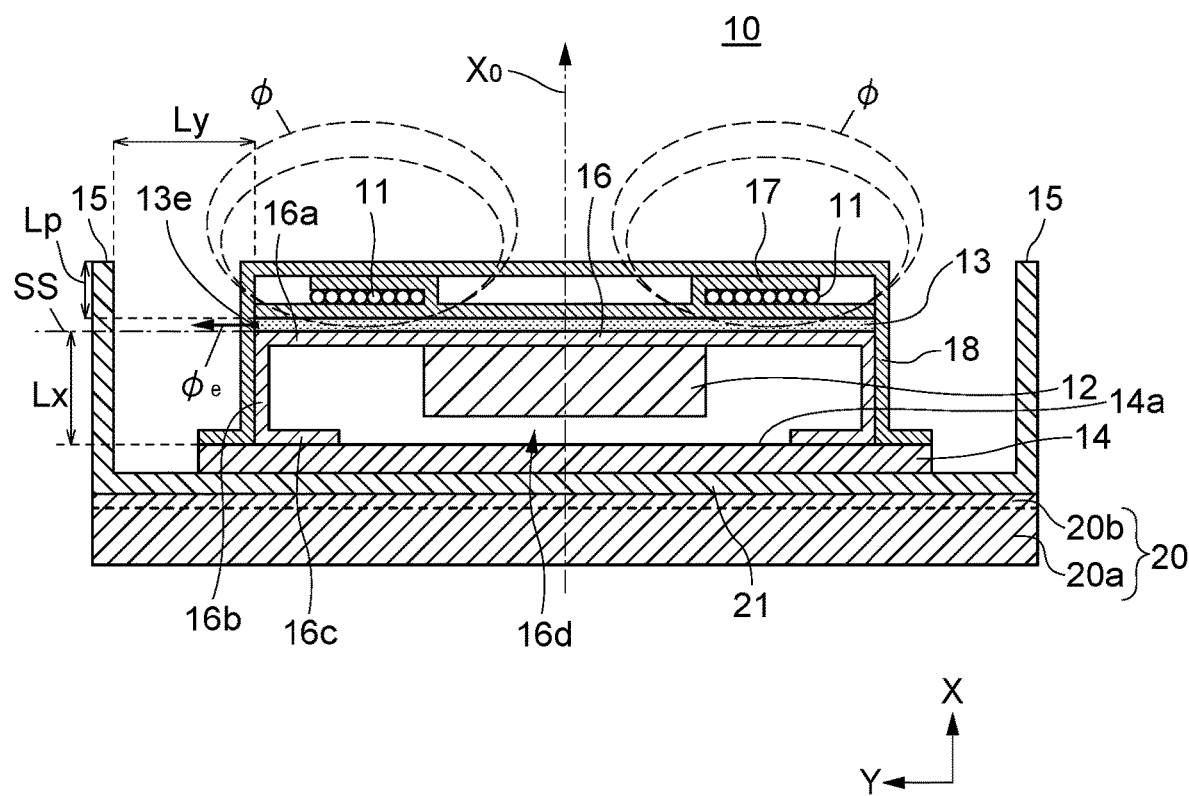
FIG. 5 is a schematic cross-sectional view illustrating the configuration of the coil unit according to a second embodiment of the present invention.

FIG. 5 is a schematic cross-sectional view illustrating the configuration of a coil unit according to the second embodiment of the present invention.

As illustrated in FIG. 5, a coil unit 10 according to the present embodiment is featured in that it further includes a side shield 15 disposed so as to cover the periphery of the coil 11. The side shield 15 is integrally formed with a flat plate part 21 parallel to the base shield 14 by bending of a single metal plate such as a copper plate or an aluminum plate. The side shield 15 may be formed of a member separate from the flat plate part 21. The side shield 15 is disposed spaced apart from the end portion 13e of the magnetic member 13 in the Y-axis direction, and a distance Ly (first distance) from the magnetic member 13 to the side shield 15 in the Y-axis direction is larger than at least 0 and preferably larger than a distance from the center of the coil 11 to the innermost conductive wire closest to the center of the coil 11. This allows a leakage magnetic flux largely circulating a region away from its opposing coil to be shielded while suppressing shielding of a main magnetic flux contributing to power transmission, whereby it is possible to reduce the leakage magnetic flux while maintaining a desired power transmission efficiency.

The shield box 16 is provided between the magnetic member 13 and the base shield 14 and, thus, the base shield 14 is also disposed spaced apart from the magnetic member 13 in the X-axis direction (axial direction of the coil). That is, a distance Lx (second distance) from a reference plane SS including the back surface of the magnetic member 13 that faces away from the surface thereof opposite to the coil 11 to the base shield 14 in the X-axis direction is larger than 0. The base shield 14 only needs to be separated away in the X-axis direction from the reference plane SS at least in a region between the end portion 13e of the magnetic member 13 and the side shield 15. With this configuration, the main magnetic flux contributing to power transmission can be prevented from being shielded by the base shield 14. Thus, it is possible to enhance power transmission efficiency while suppressing heat generation of the base shield 14.

A length Lp of apart of the side shield 15 that protrudes forward from the magnetic member 13 in the extending direction of the coil axis $X_0$ of the coil 11 is larger than at least 0 and preferably smaller than both the distance Ly from the end portion 13e of the magnetic member 13 to the side shield 15 in the Y-axis direction and the distance Lx from the magnetic member 13 to the base shield 14. The distance Lx from the magnetic member 13 to the base shield 14 is preferably smaller than the distance Ly from the end portion 13e of the magnetic member 13 to the side shield 15 and, more preferably, equal to or larger than 0.6 times the Ly and smaller than 1 time the Ly (0.6 Ly≤Lx<Ly). With this configuration, the side shield 15 of a proper size can be provided at a position properly separated from the end portion 13e of the magnetic member 13. This allows reduction in a leakage magnetic flux largely circulating a region away from its opposing coil while suppressing shielding of the main magnetic flux contributing to power transmission, whereby it is possible to reduce noise while maintaining a desired power transmission efficiency. Further, not only the side shield 15, but also the base shield 14 can be provided at a position properly separated from the end portion 13e of the magnetic member 13. Thus, it is possible to suppress an increase in the thickness of the coil unit while suppressing heat generation of the base shield 14.

Further, in the present embodiment, the base shield 14 is provided on the metal flat plate part 21 integrally formed with the side shield 15, and the heat sink 20 is connected to the base shield 14 through the flat plate part 21. The heat sink 20 does not contact the back surface of the base shield 14 but is thermally connected to the base shield 14 through the flat plate part 21. Thus, heat generated in the coil 11 or magnetic member 13 can be transmitted to the heat sink 20 to enhance heat radiation performance. That is, the same effects as those in the first embodiment can be obtained. Although the flat plate part 21 is formed of a member separate from the base shield 14 in the present embodiment, the flat plate part 21 and the base shield 14 may be made common and integrally formed.

It is apparent that the present invention is not limited to the above embodiments, but may be modified and changed without departing from the scope and spirit of the invention.

For example, in the above embodiments, both the power transmitting device 2 and power receiving device 3 use the coil unit 10 according to the present invention; however, the present invention is not limited to this, only one of the power transmitting device 2 and power receiving device 3 may use the coil unit 10 according to the present invention.

Further, although the shield box 16 has the flange part 16c in the above embodiments, the flange part 16c may be omitted. Further, the flange part 16c is formed by bending inward the leading end portion of the side wall 16b in the above embodiments, it may be formed by bending outward the leading end portion of the side wall 16b.

As described above, according to the present embodiments, there is provided a coil unit including: a coil formed by spirally winding a conductive wire; a capacitor electrically connected to the coil; a magnetic member disposed on one end side of the coil in the axial direction of the coil; a first metal shield disposed on the side of the magnetic member that faces away from the surface thereof opposite to the coil; and a second metal shield disposed between the magnetic member and the first metal shield so as to form a space for housing the capacitor. The second metal shield is disposed so as to be thermally connected to the first metal shield. The outer dimension of the second metal shield outer dimension of the second metal shield is equal to or smaller than the outer dimension of the magnetic member.

According to the present embodiments, the outer dimension of the second metal shield is equal to or smaller than the outer dimension of the magnetic member, so that a magnetic flux generated from the coil can be prevented from interlinking the second metal shield to thereby prevent heat generation of the second metal shield. Further, heat generated from the coil and magnetic member due to current flow in the coil during power transmission can be efficiently radiated to the first metal shield side. Thus, it is possible to efficiently radiate heat generated in the coil unit while suppressing heat generation.

In the present embodiments, the second metal shield is preferably disposed so as to be thermally connected to the magnetic member. This allows heat generated in the coil unit to be radiated more efficiently.

In the present embodiments, the second metal shield preferably includes a flat plate part disposed opposite to the magnetic member and a side wall connected to the flat plate part and disposed around the capacitor. Thus, with a simple configuration, it is possible to ensure not only a space for housing the capacitor but also a heat radiation path for the coil or magnetic member.

In the present embodiments, the leading end portion of the side wall directed from the flat plate part to the first metal shield is preferably arranged opposite to a main surface of the first metal shield. Thus, even when the position of the first metal shield with respect to the second metal shield is displaced, a contact area between the first metal shield and the second metal shield can continuously be ensured to thereby prevent deterioration in heat radiation performance.

In the present embodiments, an opening is preferably formed in a part of the side wall, through which a power cable connected to the coil or capacitor is drawn outside. This allows a terminal of the coil unit to be easily drawn.

In the present embodiments, it is preferable that the second metal shield has a planar shape elongated in one direction as viewed in the axial direction of the coil, that the coil axis extends in substantially the horizontal direction, and that the opening is formed on one end side of the second metal shield in the longitudinal direction thereof. With this configuration, the height of the coil unit can be reduced in a system where power transmission is performed in substantially the horizontal direction with the surface of the coil arranged substantially vertically. Further, the substantially vertically arranged coil surface prevents a metal foreign matter from adhering to the coil surface, thereby making it possible to avoid deterioration in power transmission efficiency due to the metal foreign matter and heat generation of the metal foreign matter. The coil axis only needs to extend substantially horizontally and need not extend strictly horizontally. Thus, the angle of the coil axis only needs to fall within ±10° with respect to the horizontal axis.

In the present embodiments, it is preferable that the second metal shield further includes a flange part formed by bending the leading end portion of the side wall inward or outward, and that the flange part is thermally connected to the main surface of the first metal shield. This allows reduction in heat resistance between the first metal shield and the second metal shield to thereby enhance heat radiation performance.

In the present embodiments, it is preferable that the second metal shield has a planar shape elongated in one direction as viewed in the axial direction of the coil, and that the flange part is provided so as to extend in the longitudinal direction of the second metal shield. This allows an area of the flange part to be ensured as widely as possible, which in turn allows reduction in heat resistance of the flange part to thereby enhance heat radiation performance.

In the present embodiments, the outer dimension of the second metal shield as viewed in the axial direction of the coil is equal to or larger than the outer dimension of the coil. With this configuration, it is possible to reliably support the coil and capacitor on the main surface of the first metal shield and to obtain desired shield and heat radiation effects.

In the present embodiments, the outer dimension of the first metal shield as viewed in the axial direction of the coil is preferably larger than the outer dimension of the second metal shield. This allows heat radiation performance of the entire coil unit to be enhanced.

In the present embodiments, a heat sink is preferably provided on the side of the first metal shield that faces away from the surface thereof opposite to the second metal shield. The structure in which the heat sink is provided on the back surface of the first metal shield allows achievement of height reduction of the coil unit, enhancement of power transmission efficiency, and more efficient radiation of heat generated in the coil unit and is thus advantageous in a system where power transmission is performed horizontally.

A power transmitting device according to the present embodiments includes a coil unit having the above-described features of the present embodiments and an inverter circuit connected to the coil unit. According to the present embodiments, there can be provided a power transmitting device capable of reducing a leakage magnetic flux largely circulating a region away from its opposing coil while suppressing heat generation.

A power receiving device according to the present embodiments includes a coil unit having the above-described features of the present embodiments and a rectifying circuit connected to the coil unit. According to the present embodiments, there can be provided a power receiving device capable of reducing a leakage magnetic flux largely circulating a region away from its opposing coil while suppressing heat generation.

A wireless power transmission system according to the present embodiments includes a power transmitting device that transmits power by wireless and a power receiving device that receives the power from the power transmitting device by wireless. At least one of the power transmitting device and power receiving device includes a coil unit having the above-described features of the present embodiments. According to the present embodiments, there can be provided a wireless power transmission system capable of reducing a leakage magnetic flux largely circulating a region away from its opposing coil while suppressing heat generation.

According to the present embodiments, there can be provided a coil unit capable of radiating heat efficiently while suppressing heat generation and a power transmitting device, a power receiving device and a wireless power transmission system using the coil unit.

What is claimed is:

1. A coil unit comprising:
a coil formed by spirally winding a conductive wire;
a capacitor electrically connected to the coil;
a magnetic member covering the coil in an axial direction of the coil;
a first metal shield covering the coil with the magnetic member interposed therebetween; and
a second metal shield disposed between the magnetic member and the first metal shield so as to form a space for housing the capacitor,
wherein a surface of the capacitor that is closest to the coil in the axial direction of the coil is located farther from the coil than the magnetic member;
wherein the second metal shield is disposed so as to be thermally connected to the first metal shield, and
wherein an outer dimension of the second metal shield as viewed in the axial direction of the coil is equal to or smaller than an outer dimension of the magnetic member.

2. The coil unit as claimed in claim 1, wherein the second metal shield is disposed so as to be thermally connected to the magnetic member.

3. The coil unit as claimed in claim 1, wherein the second metal shield includes a flat plate part facing to the magnetic member and a side wall connected to the flat plate part and disposed around the capacitor.

4. The coil unit as claimed in claim 3, wherein a leading end portion of the side wall directed from the flat plate part to the first metal shield is arranged opposite to a main surface of the first metal shield.

5. The coil unit as claimed in claim 3, wherein an opening is formed in a part of the side wall, through which a power cable connected to the coil or capacitor is drawn outside.

6. The coil unit as claimed in claim 5,
wherein the second metal shield has a planar shape elongated in one direction as viewed in the axial direction of the coil,
wherein the coil axis extends in substantially a horizontal direction, and
wherein the opening is formed on one end side of the second metal shield in a longitudinal direction thereof.

7. The coil unit as claimed in claim 3,
wherein the second metal shield further includes a flange part formed by bending a leading end portion of the side wall inward or outward, and
wherein the flange part is thermally connected to a main surface of the first metal shield.

8. The coil unit as claimed in claim 7,
wherein the second metal shield has a planar shape elongated in one direction as viewed in the axial direction of the coil, and
wherein the flange part is provided so as to extend in a longitudinal direction of the second metal shield.

9. The coil unit as claimed in claim 1, wherein an outer dimension of the second metal shield as viewed in the axial direction of the coil is equal to or larger than an outer dimension of the coil.

10. The coil unit as claimed in claim 1, wherein an outer dimension of the first metal shield as viewed in the axial direction of the coil is larger than an outer dimension of the second metal shield.

11. The coil unit as claimed in claim 1, further comprising a heat sink provided on a rear side of the first metal shield opposite to a front side facing to the second metal shield.

12. A power transmitting device comprising:
a coil unit; and
an inverter circuit connected to the coil unit,
wherein the coil unit comprising:
a coil formed by spirally winding a conductive wire;
a capacitor electrically connected to the coil;
a magnetic member covering the coil in an axial direction of the coil;
a first metal shield covering the coil with the magnetic member interposed therebetween; and
a second metal shield disposed between the magnetic member and the first metal shield so as to form a space for housing the capacitor,
wherein a surface of the capacitor that is closest to the coil in the axial direction of the coil is located farther from the coil than the magnetic member;
wherein the second metal shield is disposed so as to be thermally connected to the first metal shield, and wherein an outer dimension of the second metal shield as viewed in the axial direction of the coil is equal to or smaller than an outer dimension of the magnetic member.

13. A power receiving device comprising:
a coil unit; and
a rectifying circuit connected to the coil unit,
wherein the coil unit comprising:
  a coil formed by spirally winding a conductive wire;
  a capacitor electrically connected to the coil;
  a magnetic member covering the coil in an axial direction of the coil;
  a first metal shield covering the coil with the magnetic member interposed therebetween; and
  a second metal shield disposed between the magnetic member and the first metal shield so as to form a space for housing the capacitor,
wherein a surface of the capacitor that is closest to the coil in the axial direction of the coil is located farther from the coil than the magnetic member;
wherein the second metal shield is disposed so as to be thermally connected to the first metal shield, and
wherein an outer dimension of the second metal shield as viewed in the axial direction of the coil is equal to or smaller than an outer dimension of the magnetic member.

14. A wireless power transmission system comprising:
a power transmitting device that transmits power by wireless; and
a power receiving device that receives the power from the power transmitting device by wireless,
wherein at least one of the power transmitting device and power receiving device includes a coil unit that comprises:
  a coil formed by spirally winding a conductive wire;
  a capacitor electrically connected to the coil;
  a magnetic member covering the coil in an axial direction of the coil;
  a first metal shield covering the coil with the magnetic member interposed therebetween; and
  a second metal shield disposed between the magnetic member and the first metal shield so as to form a space for housing the capacitor,
wherein a surface of the capacitor that is closest to the coil in the axial direction of the coil is located farther from the coil than the magnetic member;
wherein the second metal shield is disposed so as to be thermally connected to the first metal shield, and
wherein an outer dimension of the second metal shield as viewed in the axial direction of the coil is equal to or smaller than an outer dimension of the magnetic member.

* * * * *